United States Patent
Lee et al.

(10) Patent No.: US 8,258,622 B2
(45) Date of Patent: Sep. 4, 2012

(54) POWER DEVICE PACKAGE AND SEMICONDUCTOR PACKAGE MOLD FOR FABRICATING THE SAME

(75) Inventors: Keun-hyuk Lee, Gyeonggi-do (KR);
Seung-won Lim, Gyeonggi-do (KR);
Sung-min Park, Seoul (KR)

(73) Assignee: Fairchild Korea Semiconductor, Ltd., Dodang-Dong, Wonmi-Gu Bucheon-Si, Gyeonggi-Do (KR)

( * ) Notice: Subject to any disclaimer, the term of this patent is extended or adjusted under 35 U.S.C. 154(b) by 293 days.

(21) Appl. No.: 12/011,844

(22) Filed: Jan. 29, 2008

(65) Prior Publication Data

US 2008/0203559 A1   Aug. 28, 2008

(30) Foreign Application Priority Data

Feb. 28, 2007   (KR) ................ 10-2007-0020564

(51) Int. Cl.
*H01L 23/10*   (2006.01)
*H01L 23/34*   (2006.01)

(52) U.S. Cl. ........ 257/727; 257/706; 257/712; 257/726; 257/E23.084

(58) Field of Classification Search ............. 257/687, 257/712, 718, 787, E23.128, 706, 726, 727, 257/E23.084
See application file for complete search history.

(56) References Cited

U.S. PATENT DOCUMENTS

| | | | | |
|---|---|---|---|---|
| 3,377,524 A | * | 4/1968 | Bock et al. | 257/717 |
| 3,906,144 A | * | 9/1975 | Wiley | 174/526 |
| 4,266,267 A | * | 5/1981 | Ruegg | 361/717 |
| 4,342,068 A | * | 7/1982 | Kling | 361/717 |
| 4,649,637 A | * | 3/1987 | Hatakeyama | 29/827 |
| 4,750,030 A | * | 6/1988 | Hatakeyama | 257/671 |
| 4,758,927 A | * | 7/1988 | Berg | 361/761 |
| 4,878,108 A | * | 10/1989 | Phelps et al. | 257/796 |
| 4,888,307 A | * | 12/1989 | Spairisano et al. | 264/272.17 |
| 4,916,522 A | * | 4/1990 | Cohn | 257/687 |
| 5,063,434 A | * | 11/1991 | Emoto | 257/706 |
| 5,378,924 A | * | 1/1995 | Liang | 257/675 |
| 5,434,449 A | * | 7/1995 | Himeno et al. | 257/690 |
| 5,442,234 A | * | 8/1995 | Liang | 257/675 |
| 5,519,252 A | * | 5/1996 | Soyano et al. | 257/690 |
| 5,563,447 A | * | 10/1996 | Lake et al. | 257/724 |
| 5,592,021 A | * | 1/1997 | Meschter et al. | 257/727 |
| 5,625,536 A | * | 4/1997 | Soyano et al. | 361/736 |
| 5,793,106 A | * | 8/1998 | Yasukawa et al. | 257/712 |
| 5,838,064 A | * | 11/1998 | Shimada et al. | 257/718 |
| 5,883,782 A | * | 3/1999 | Thurston et al. | 361/704 |
| 6,061,240 A | * | 5/2000 | Butterbaugh et al. | 361/704 |
| 6,388,885 B1 | * | 5/2002 | Alexander et al. | 361/760 |

(Continued)

FOREIGN PATENT DOCUMENTS

JP   59139656 A   *   8/1984

(Continued)

*Primary Examiner* — Teresa M Arroyo

(74) *Attorney, Agent, or Firm* — Kenneth E. Horton; Kirton McConkie, PC

(57) ABSTRACT

Provided are a power device package coupled to a heat sink using a bolt and a semiconductor package mold for fabricating the same. The power device package includes: a substrate; at least one power device mounted on the substrate; a mold member sealing the substrate and the power device; and at least one bushing member fixed to the mold member to provide a through hole for a bolt member for coupling a heat sink to the mold member.

25 Claims, 4 Drawing Sheets

U.S. PATENT DOCUMENTS

| | | | |
|---|---|---|---|
| 6,489,678 B1 | 12/2002 | Joshi | |
| 6,532,152 B1 * | 3/2003 | White et al. | 361/692 |
| 6,541,874 B2 * | 4/2003 | Nguyen et al. | 257/787 |
| 6,566,749 B1 | 5/2003 | Joshi et al. | |
| 6,574,107 B2 | 6/2003 | Jeon et al. | |
| 6,621,152 B2 | 9/2003 | Choi et al. | |
| 6,627,991 B1 | 9/2003 | Joshi | |
| 6,642,738 B2 | 11/2003 | Elbanhawy | |
| 6,645,791 B2 | 11/2003 | Noquil et al. | |
| 6,674,157 B2 | 1/2004 | Lang | |
| 6,683,375 B2 | 1/2004 | Joshi et al. | |
| 6,696,321 B2 | 2/2004 | Joshi | |
| 6,700,194 B2 * | 3/2004 | Nakajima et al. | 257/707 |
| 6,720,642 B1 | 4/2004 | Joshi et al. | |
| 6,731,003 B2 | 5/2004 | Joshi et al. | |
| 6,740,541 B2 | 5/2004 | Rajeev | |
| 6,756,689 B2 | 6/2004 | Nam et al. | |
| 6,774,465 B2 | 8/2004 | Lee et al. | |
| 6,777,800 B2 | 8/2004 | Madrid et al. | |
| 6,785,137 B2 * | 8/2004 | Siegel | 361/704 |
| 6,797,880 B2 * | 9/2004 | Kirchberger et al. | 174/548 |
| 6,806,580 B2 | 10/2004 | Joshi et al. | |
| 6,830,959 B2 | 12/2004 | Estacio | |
| 6,836,023 B2 | 12/2004 | Joshi et al. | |
| 6,867,481 B2 | 3/2005 | Joshi et al. | |
| 6,867,489 B1 | 3/2005 | Estacio | |
| 6,891,256 B2 | 5/2005 | Joshi et al. | |
| 6,891,257 B2 | 5/2005 | Chong et al. | |
| 6,893,901 B2 | 5/2005 | Madrid | |
| 6,903,457 B2 * | 6/2005 | Nakajima et al. | 257/717 |
| 6,943,434 B2 | 9/2005 | Tangpuz et al. | |
| 6,989,588 B2 | 1/2006 | Quinones et al. | |
| 6,992,384 B2 | 1/2006 | Joshi | |
| 7,022,548 B2 | 4/2006 | Joshi et al. | |
| 7,023,077 B2 | 4/2006 | Madrid | |
| 7,061,077 B2 | 6/2006 | Joshi | |
| 7,061,080 B2 | 6/2006 | Jeun et al. | |
| 7,081,666 B2 | 7/2006 | Joshi et al. | |
| 7,122,884 B2 | 10/2006 | Cabahug et al. | |
| 7,154,168 B2 | 12/2006 | Joshi et al. | |
| 7,157,799 B2 | 1/2007 | Noquil et al. | |
| 7,196,313 B2 | 3/2007 | Quinones et al. | |
| 7,199,461 B2 | 4/2007 | Son et al. | |
| 7,208,819 B2 | 4/2007 | Jeun et al. | |
| 7,215,011 B2 | 5/2007 | Joshi et al. | |
| 7,217,594 B2 | 5/2007 | Manatad | |
| 7,242,076 B2 | 7/2007 | Dolan | |
| 7,256,479 B2 | 8/2007 | Noquil et al. | |
| 7,268,414 B2 | 9/2007 | Choi et al. | |
| 7,271,497 B2 | 9/2007 | Joshi et al. | |
| 7,285,849 B2 | 10/2007 | Cruz et al. | |
| 7,315,077 B2 | 1/2008 | Choi et al. | |
| 7,332,806 B2 | 2/2008 | Joshi et al. | |
| 7,342,796 B2 * | 3/2008 | Aukzemas | 361/719 |
| 7,371,616 B2 | 5/2008 | Jereza | |
| 7,439,613 B2 | 10/2008 | Joshi et al. | |
| 7,839,004 B2 * | 11/2010 | Sakai | 257/787 |
| 2003/0146499 A1 * | 8/2003 | Kondo et al. | 257/675 |
| 2003/0200813 A1 * | 10/2003 | Baba et al. | 73/715 |
| 2005/0022970 A1 * | 2/2005 | Mania et al. | 165/80.3 |
| 2005/0212123 A1 * | 9/2005 | Labanok et al. | 257/712 |
| 2006/0267182 A1 * | 11/2006 | Rumer et al. | 257/706 |
| 2007/0205503 A1 | 9/2007 | Baek et al. | |
| 2008/0080140 A1 * | 4/2008 | Hsieh | 361/707 |
| 2011/0076111 A1 * | 3/2011 | Suefuji et al. | 411/399 |

FOREIGN PATENT DOCUMENTS

| | | |
|---|---|---|
| KR | 2007-0090555 A | 9/2007 |

* cited by examiner

POWER DEVICE PACKAGE AND SEMICONDUCTOR PACKAGE MOLD FOR FABRICATING THE SAME

CROSS-REFERENCES TO RELATED APPLICATIONS

This application claims the benefit of Korean Patent Application No. 10-2007-0020564, filed on Feb. 28, 2007, in the Korean Intellectual Property Office, the disclosure of which is incorporated herein in its entirety by reference.

BACKGROUND OF THE INVENTION

1. Field of the Invention

Embodiments of the present invention relate to a semiconductor package and a semiconductor package mold for fabricating the same, and more particularly, to a power device package coupled to a heat sink using a bolt and a semiconductor package mold for fabricating the same.

2. Description of the Related Art

Power devices, such as silicon-controlled rectifiers (SCR), power transistors, insulated-gate bipolar transistors (IGBT), metal-oxide-semiconductor (MOS) transistors, power rectifiers, power regulators, inverters, converters, and semiconductor devices comprising a combination thereof, are designed to operate in a voltage range of 30-1000 V or more. Since these power devices operate at a high voltage relative to general logic or memory devices, power device packages are required to secure an effective dissipation of heat generated from the power devices and effective endurance of insulation for high voltage operation.

Generally, a heat sink is coupled to a power device package in order to dissipate heat generated in a power device. As disclosed in Korean Patent Application No. 2006-20413 of Fairchild Korea Semiconductor, Co., Ltd., an uneven part may be formed on a surface of a power device package in order to maintain the insulation between a heat sink generally formed of an electrically conductive metal material and the power device package. Korean Patent Application No. 2006-20413 is incorporated herein by reference in its entirety.

FIG. 1 is an exploded perspective view of a conventional power device package 10 and a heat sink 30.

Referring to FIG. 1, the heat sink 30, which is formed of a metal material, may be attached to the power device package 10. The heat sink 30 is coupled to the power device package 10 using a bolt member 20 penetrating a bolt hole 10h formed in the power device package 10.

Generally, a mold member 10a, which constitutes the exterior of the power device package 10, is formed of a resin-based material such as an epoxy-molding compound (EMC), and can be formed by a transfer molding process. The power device package 10 using the resin-based material can be fabricated simply and inexpensively, and thus can be widely used. However, when the heat sink 30 is coupled to the power device package 10 using the bolt member 20, compressive stress and shear stress applied to a surface of the power device package 10 may cause cracks to be formed in the mold member 10a. These cracks formed in the power device package 10 may result in permeation paths of absorbed moisture into the power device package 10 or the insulation break-down, eventually reducing the reliability and life of the power device.

SUMMARY OF THE INVENTION

Embodiments of the present invention provide a power device package coupled to a heat sink using a bolt member, in which a mold member is not damaged during bolt coupling.

Embodiments of the present invention also provides a semiconductor package mold for fabricating a power device package in which a mold member is not damaged during bolt coupling during transfer molding.

According to an aspect of an embodiment of the present invention, there is provided a power device package including: a substrate; at least one power device or semiconductor device mounted on the substrate; a mold member sealing the substrate and the power device; and at least one bushing member fixed to the mold member to provide a through hole for a bolt member for coupling a heat sink to the mold member.

The substrate may include a surface exposed outside the mold member, and the heat sink is coupled to the exposed surface of the substrate. The substrate may include a first surface on which a conductive pattern electrically connected with the power device is formed. The substrate may include a base metal layer formed on a second surface to contact the heat sink.

The bushing member may be formed of one selected from the group consisting of aluminum, an aluminum alloy, copper, and a copper alloy. The bushing member may include a receiving part including an inner circumference surface defining the through hole and an outer circumference surface contacting the mold member. The bushing member may further include a first protruding part providing a first surface contacting a head portion of the bolt member at a first end of the receiving part. Also, the bushing member may further include a second protruding part protruding from a surface of the mold member at a second end of the receiving part.

The bushing member may further include an uneven part on the outer circumference surface of the receiving part. Also, the bushing member may include a recess part in the outer circumference surface of the receiving part.

In a power device package according to an embodiment of the present invention, a bolt member can be prevented from contacting a surface of the power device package or a compressive stress and a shear stress generated during bolt coupling is reduced by including a bushing member fixed to a mold member. This provides a through hole for a bolt member for coupling a heat sink to a mold member. Accordingly, damage such as cracking of the mold member caused due to the coupling process can be prevented.

According to another aspect of an embodiment of the present invention, there is provided a semiconductor package mold including first and second molds for fabricating a power device package using a transfer molding process. The semiconductor package mold provides a cavity configured by an inner surface of the first mold, an inner surface of the second mold, and an outer circumference surface of at least one bushing member providing a through hole for a bolt member for coupling a heat sink and a mold member to the power device package.

The inner surface of the first mold may contact a first end of the bushing member, and the inner surface of the second mold may contact a second end of the bushing member so as to provide the cavity. Also, a protruding portion may be formed on the inner surface of the first mold to provide a recess portion for receiving a head portion of the bolt member. Also, a groove may be formed in the second mold to receive a part of an end of the bushing member such that the end of the bushing member protrudes from a surface of the mold member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
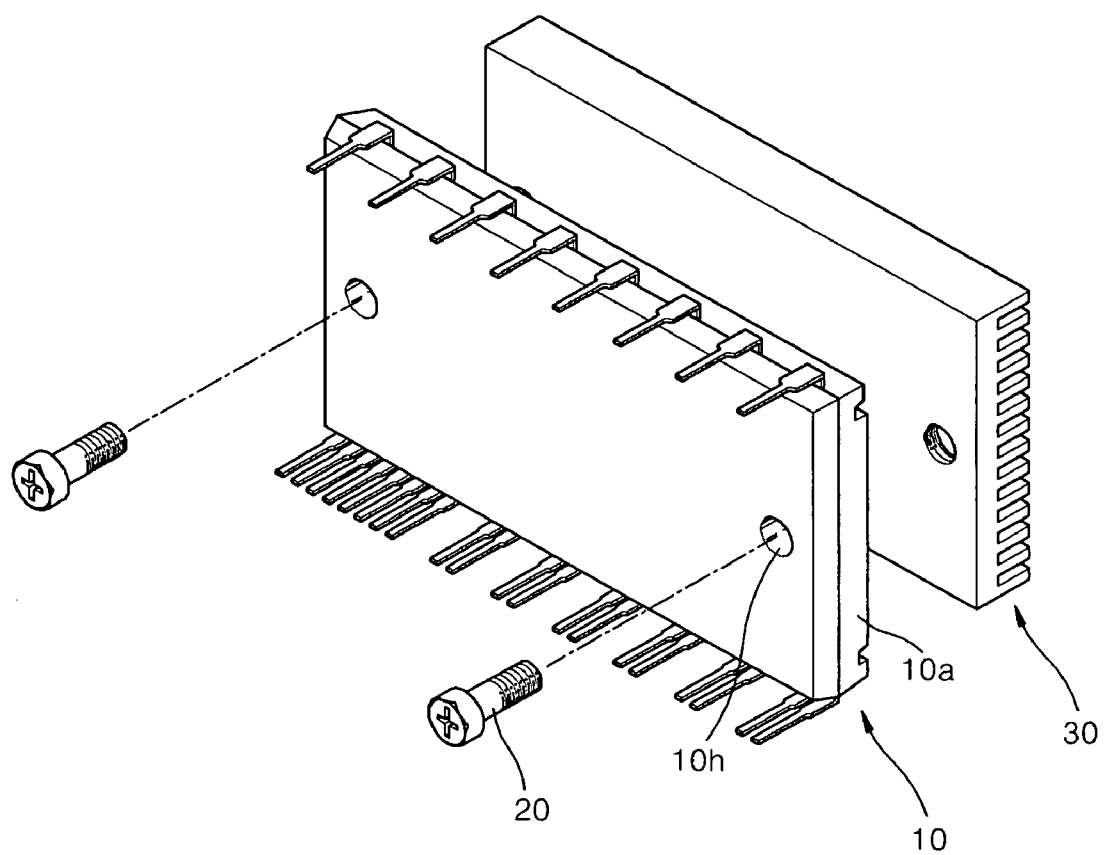
FIG. 1 is an exploded perspective view of a conventional power device package and a heat sink.

Embodiments of the present invention will now be described more fully with reference to the accompanying drawings, in which exemplary embodiments of the invention are shown.

Embodiments of the invention may, however, be embodied in many different forms and should not be construed as being limited to the embodiments set forth herein; rather, these embodiments are provided so that this disclosure will be thorough and complete, and will fully convey the concept of the invention to those skilled in the art. It will be understood that when a layer is referred to as being "on" another layer, it can be directly on the other layer, or intervening layers may also be present. In the drawings, the dimensions of layers are exaggerated for clarity of illustration, and like reference numerals in the drawings denote like elements. In the specification, terms "and/or" include one element and all combination of listed elements.

It will be understood that although the terms first and second are used herein to describe various members, compartments, regions, layer, and/or parts, these members, compartments, regions, layer, and/or parts should not be limited by these terms. These terms are only used to distinguish one member, compartment, region, layer or part from another member, compartment, region, layer or part. Therefore, a first member, compartment, region, layer or part to be described below may denote a first member, compartment, region, layer or part without departing from the spirit of the present invention.

Figure 2:
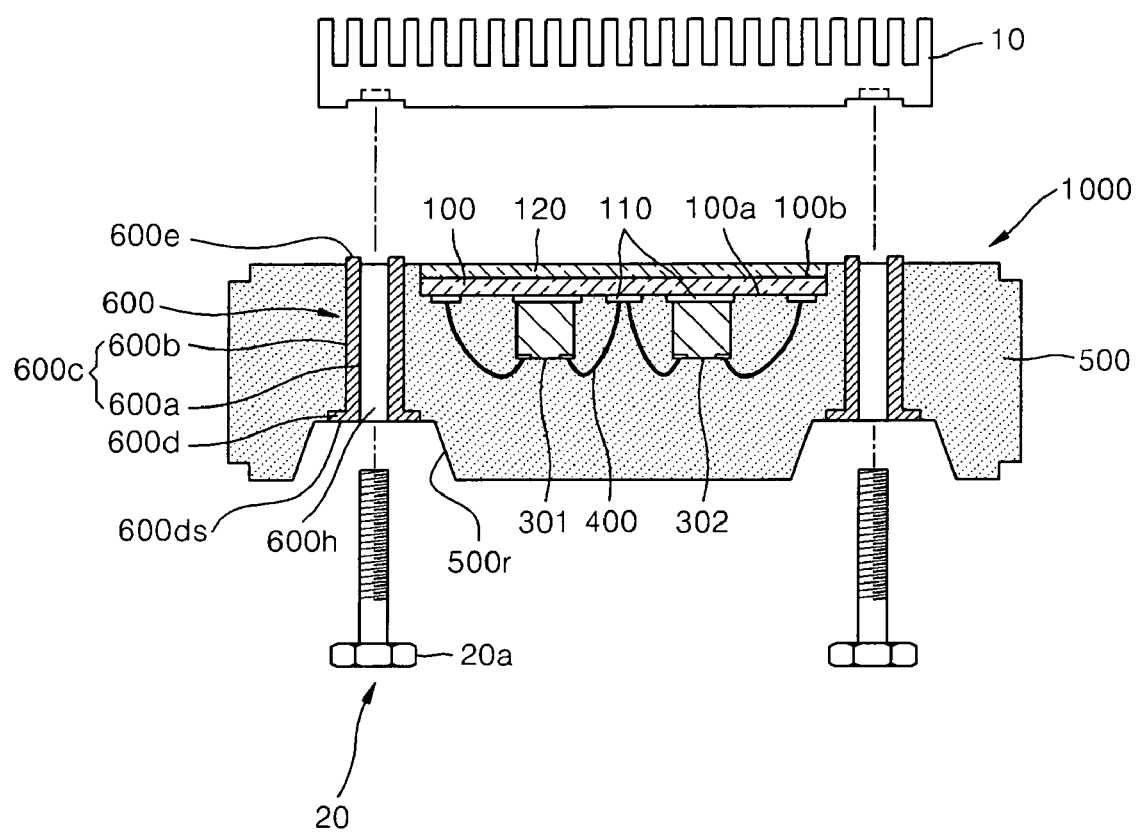
FIG. 2 is a cross-sectional view of a power device package according to an embodiment of the present invention.

FIG. 2 is a cross-sectional view of a power device package 1000, according to an embodiment of the present invention.

Referring to FIG. 2, the power device package 1000 may include a substrate 100 and at least one power device 301 mounted on the substrate 100. The power device package 1000 may further include a control device 302 such as a driver integrated circuit (IC) for controlling the power device 301, thereby providing a smart module.

In FIG. 2, the device 301 is a power device. However, the power device could alternatively be some other type of semiconductor device. Suitable semiconductor devices may comprise a semiconductor material such as silicon, and may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

The substrate 100 may be an insulating substrate including a first surface 100a with a conductive pattern 110 formed thereon. The insulating substrate may be formed of a polymer or ceramic material. The conductive pattern 110 may be electrically connected to at least one of the power device 301 and the control device 302 using a wire 400 or the like.

As is well known in the art, a lead frame (not shown) may be disposed on the substrate 100. However, the substrate 100 itself may be a lead frame in some embodiments. At least one of the power device 301 and the control device 302 may be attached to the substrate 100 or the lead frame using a soldering process for example.

The substrate 100 and devices 301 and 302 mounted on the substrate 100 may be entirely sealed with a mold member 500. In some embodiments of the present invention, as illustrated in FIG. 2, a second surface 100b of the substrate 100 may be exposed outside the mold member 500 in order to improve the dissipation efficiency of heat generated from at least one of the power device 301 and the control device 302. The substrate 100 may further include a base metal layer 120 formed on the second surface 100b to contact a heat sink 10. In this case, the base metal layer 120 may be exposed outside the mold member 500. The base metal layer 120 may be formed of a material having excellent thermal conductivity, such as aluminum, an aluminum alloy, copper, or a copper alloy.

The power device package 1000 may include one or more bushing members 600 that provide a through hole 600h for a bolt member 20 for coupling to the heat sink 10. The bushing members 600 may include a receiving part 600c including an inner circumference surface 600a defining the through hole 600h for the bolt member 20 and an outer circumference surface 600b contacting the mold member 500. The bushing member 600 may be fixed in the power device package 1000 by contacting the mold member 500.

Figure 3A:
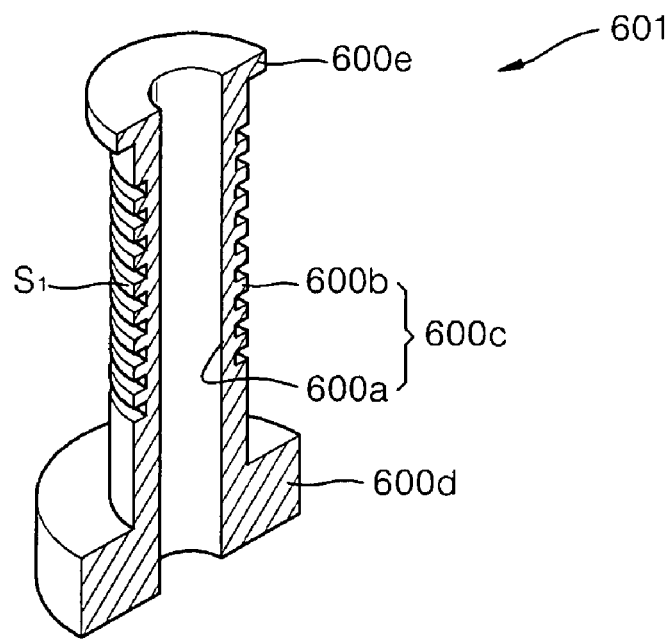
FIGS. 3A and 3B are sectional perspective views of bushing members according to embodiments of the present invention.
Figure 3B:
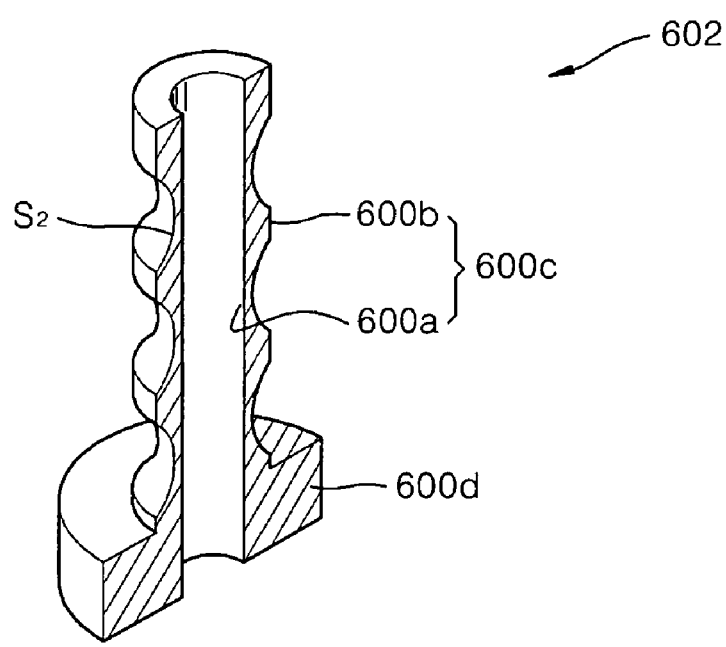

FIGS. 3A and 3B are sectional perspective views of bushing members 601 and 602 according to embodiments of the present invention.

Referring to FIG. 3A, the bushing member 601 may further include an uneven part S1 in an outer circumference surface 600b of a receiving part 600c in order to improve a coupling force between the bushing member 601 and the mold member 500. Referring to FIG. 3B, the bushing member 602 may further include a recess part S2 in an outer circumference 600b of a receiving part 600c. Due to the uneven part S1 and the recess part S2 of the bushing members 601 and 602, respectively, the contact area between the bushing members 601 and 602 and the mold member 500 may be increased, thus improving the coupling force between the bushing members 601 and 602 and the mold member 500.

Referring to FIG. 2 again together with FIGS. 3A and 3B, the mold member 500 may include a recess portion 500r receiving a head portion 20a of the bolt member 20. The bushing member 600 may include a first protruding part 600d for providing a first surface 600ds contacting the head portion 20a of the bolt member 20 at a first end of the receiving part 600c. The first protruding part 600d prevents the head portion 20a of the bolt member 20 from directly contacting a surface of the mold member 500 of the power device package 1000, thereby preventing cracks from being formed during bolt coupling.

In some embodiments of the present invention, the bushing member 600 may further include a second protruding part 600e protruding from a surface of the mold member 500 at a second end of the receiving part 600c. The second protruding part 600e may contact the heat sink 10. In this case, the second protruding part 600e may provide a heat transfer path for transferring heat generated in the power device package 1000 to the heat sink 10. Also, the second protruding part 600e may contact a portion of a semiconductor package mold to define a cavity including the outer circumference surface 600b of the bushing member 600, as will be described later. Accordingly, the mold member 500 to be injected, as will be described later, can be prevented from leaking into the through hole 600h of the bushing member 600 during a transfer molding process.

The second protruding part 600e may have any shape that does not disturb coupling of the bolt member 20 passing through the through hole 600h of the bushing member 600. For example, the second protruding part 600e may extend in a direction perpendicular to the extending direction of the receiving part 600c similarly to the first protruding part 600d of the bushing member 600, as illustrated in FIG. 3A. In this case, the second protruding part 600e improves a mechanical fixing force between the mold member 500 and the bushing members 600, 601 and 602, together with the first protruding part 600d. The bushing members 600, 601 and 602 may be formed of a metal material having excellent strength and thermal conductivity, such as aluminum, an aluminum alloy, copper, or a copper alloy.

In the present embodiment, the bushing member 600 illustrated in FIG. 2 is spaced apart from the substrate 100, but the present invention is not limited thereto, and the bushing member 600 may contact the substrate 100. The power device package 1000 according to the embodiment of the present invention may be fabricated using an inexpensive transfer molding process. A semiconductor package mold for fabricating the power device package including the bushing member will be described below.

Figure 4:
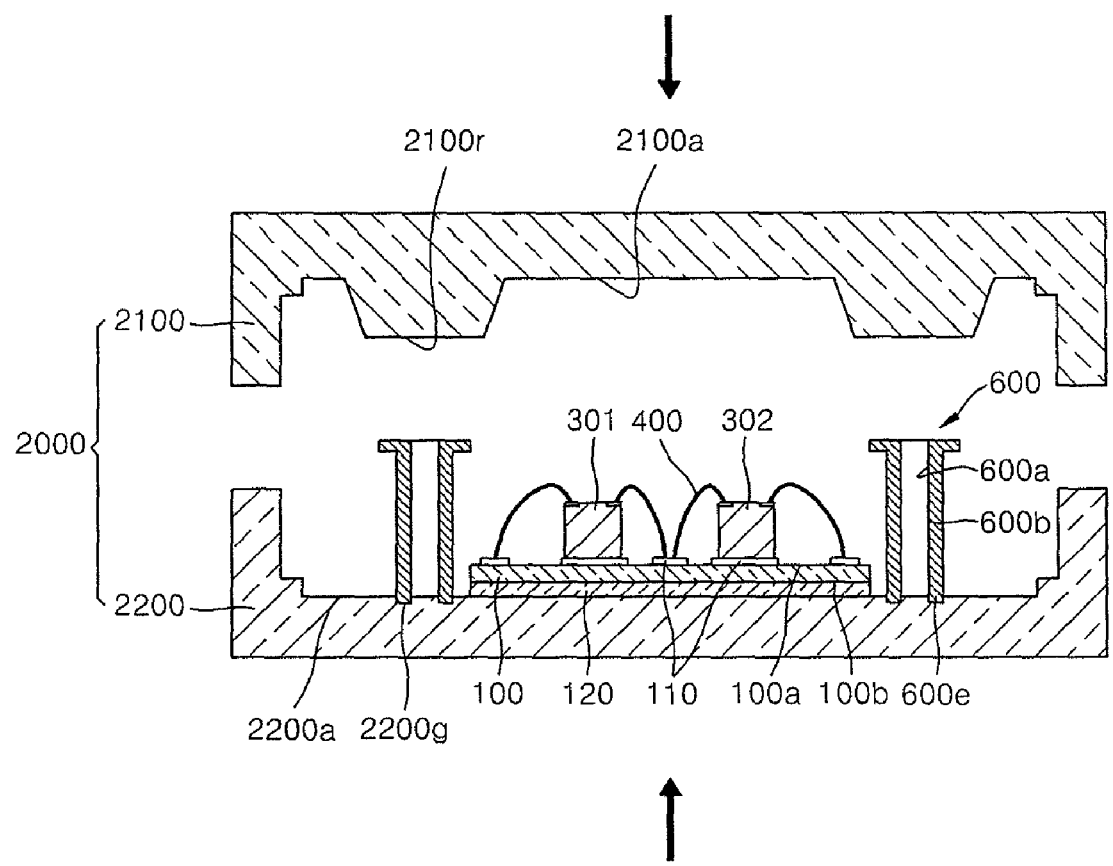
FIG. 4 is a cross-sectional view of a semiconductor package mold according to an embodiment of the present invention.

FIG. 4 is a cross-sectional view of a semiconductor package mold 2000 according to an embodiment of the present invention.

Referring to FIG. 4, the semiconductor package mold 2000 includes a first mold 2100 and a second mold 2200. As illustrated in FIG. 4, the first and second molds 2100 and 2200 may serve as upper and lower molds, respectively. However, the present invention is not limited thereto, and the first and second molds 2100 and 2200 may serve as lower and upper molds, respectively.

Prior to a molding process, as illustrated in FIG. 2, a wiring process is performed on elements such as the power device 301 mounted on a substrate 100. Then, a cutting process and any other suitable process may be performed. Then, the substrate 100 may be loaded on the second mold 2200. A base metal layer 120 may be formed on a second surface 100b of the substrate 100. The base metal layer 120 may directly contact the second mold 2200 such that a surface of the base metal layer 120 can be exposed outside the mold member 500 as illustrated in FIG. 2. In some embodiments, the base metal layer 120 need not be present. Also, a bushing member 600 may be loaded inside the semiconductor package mold 2000.

In order to perform the transfer molding process, when the first and second molds 2100 and 2200 move in directions indicated by the illustrated arrows, respectively, and are pressed together, a cavity, which is defined by an outer circumference surface 600b of the bushing member 600 disposed inside the semiconductor package mold 2000, an inner surface 2100a of the first mold 2100, and an inner surface 2200a of the second mold 2200, is provided. After that, a molding material such as an epoxy-molding compound (EMC) is injected into the cavity. The injected mold member may seal the substrate 100 where a power device 301 or the like is mounted and the outer circumference surface 600b of the bushing member 600.

A protruding part 2100r may be formed on the inner surface 2100a of the first mold 2100 in order to form the recess portion 500r for receiving the head portion 20a of the bolt member 20 in the mold member 500, as illustrated in FIG. 2. Also, a groove 2200g for receiving the second protruding part 600e may be formed in the inner surface 2200a of the second mold 2200 in order to form the second protruding part 600e at the second end of the bushing member 600, as illustrated in FIG. 2. For the transfer molding process, the second protruding part 600e may be inserted into the groove 2200g of the second mold 2200 when the first and second molds 2100 and 2200 are pressed together. In this case, although a transfer pressure of the mold member material injected into the cavity is high, flow of the mold member material is blocked by the second protruding part 600e inserted into the groove 2200g, thereby preventing the injected mold member from leaking into the through hole 600h of the bushing member 600.

In FIG. 4, the second protruding part 600e of the bushing member 600 is inserted into the groove 2200g. However, it will be understood by those of ordinary skill in the art that a pleat part or an uneven part may be formed in a surface of the second protruding part 600e, and a pleat counterpart for receiving the pleat part or the uneven part formed in the second protruding part 600e of the bushing member 600 may be formed in the inner surface 2200a of the second mold 2200.

As described above, the power device package according to the present invention can prevent a bolt member from contacting a surface of the power device package or reduce compressive stress and shear stress generated during bolt coupling by including a bushing member fixed to a mold member to provide a through hole for a bolt member for coupling a heat sink to a mold member. Accordingly, damage such as cracking of the mold member caused due to the coupling process can be prevented.

Also, for the semiconductor package mold according to the present invention, a transfer molding process for fabricating a power device package including a bushing member can be performed by including first and second molds configuring a cavity together with an outer circumference surface of the bushing member.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power device package comprising:
   a substrate;
   at least one power device mounted on the substrate;
   a mold member sealing the substrate and the power device, the mold member having an upper surface and a lower surface;
   a heat sink coupled to the substrate;
   at least one bolt member configured to fix the mold member to the heat sink; and
   at least one bushing member fixed to the mold member to provide a through hole penetrating the mold member,
   wherein the at least one bushing member protrudes from both the upper surface and the lower surface of the mold member, and wherein the bolt member is inserted into the through hole for coupling the heat sink to the mold member.

2. The power device package of claim 1, wherein the substrate comprises a surface exposed outside the mold member, and the heat sink is coupled to the exposed surface of the substrate.

3. The power device package of claim 1, wherein the substrate and the power device are entirely sealed by the mold member.

4. The power device package of claim 1, wherein the substrate is a lead frame.

5. The power device package of claim 1, wherein the substrate is an insulating substrate comprising a first surface on which a conductive pattern electrically connected with the power device is formed.

6. The power device package of claim 5, wherein the insulating substrate is a ceramic substrate.

7. The power device package of claim 5, wherein the substrate comprises:
a second surface opposite to the first surface; and
a base metal layer formed on the second surface to contact the heat sink.

8. The power device package of claim 7, wherein the base metal layer is formed of one selected from the group consisting of aluminum, an aluminum alloy, copper, and a copper alloy.

9. The power device package of claim 1, further comprising at least one control device for controlling the power device mounted on the substrate.

10. The power device package of claim 1, wherein the bushing member is formed of one selected from the group consisting of aluminum, an aluminum alloy, copper, and a copper alloy.

11. The power device package of claim 1, wherein the mold member comprises a recess portion receiving a head portion of the bolt member.

12. The power device package of claim 1, wherein the bushing member comprises a receiving part comprising an inner circumference surface defining the through hole and an outer circumference surface contacting the mold member.

13. The power device package of claim 12, wherein the bushing member further comprises a first protruding part providing a first surface contacting a head portion of the bolt member at a first end of the receiving part.

14. The power device package of claim 12, wherein the bushing member further comprises a second protruding part protruding from a surface of the mold member at a second end of the receiving part.

15. The power device package of claim 12, wherein the bushing member further comprises an uneven part on the outer circumference surface of the receiving part.

16. The power device package of claim 12, wherein the bushing member comprises a recess part in the outer circumference surface of the receiving part.

17. The power device package of claim 1, wherein the bushing member is spaced apart from the substrate.

18. The power device package of claim 1, wherein the mold member is injected using a transfer molding process.

19. The power device package of claim 1, wherein the molding member directly covers an outer circumference surface of the at least one bushing member.

20. The power device package of claim 1, wherein the bolt member has a head portion, a first body portion, and a second body portion, and
wherein the first body portion is fixed to the through hole, and the second body portion is fixed to the heat sink.

21. The power device package of claim 20, wherein the bushing member has a first surface and a second surface opposite to the first surface,
wherein the heat sink directly contacts with the first surface, and
wherein the head portion of the bolt member does not contact with the mold member but with the second surface of the bushing member, thereby preventing stress applied to the mold member when inserting the bolt member into the through hole of the bushing member.

22. A power device package comprising:
a substrate;
at least one semiconductor device mounted on the substrate;
a mold member sealing the substrate and the semiconductor device, the mold member having an upper surface and a lower surface; and
at least one bushing member fixed to the mold member,
wherein the at least one bushing member includes a first surface and a second surface, the first surface being exposed by the upper surface of the mold member and the second surface being exposed by the lower surface of the mold member, and
wherein each of the at least one bushing member comprises a through hole penetrating the mold member, wherein the second surface is at a height greater than the lower surface so that the second surface protrudes from the lower surface.

23. The power device package of claim 22, further comprising:
a heat sink directly contacting with the second surface and the lower surface; and
at least one bolt member having a head portion, a first body portion, and a second body portion,
wherein the first body portion is fixed to the through hole, and the second body portion is fixed to the heat sink.

24. The power device package of claim 23, wherein a head portion of the bolt member directly contacts with the first surface of the bushing member.

25. The power device package of claim 23, wherein a head portion of the bolt member does not contact with the mold member, but does contact with the first surface of the bushing member, thereby preventing stress applied to the mold member when inserting the bolt member into the through hole of the bushing member.

* * * * *